(12) United States Patent
Kim et al.

(10) Patent No.: US 7,868,550 B2
(45) Date of Patent: Jan. 11, 2011

(54) PROTECTIVE LAYER MATERIAL FOR PDP AND METHOD OF MANUFACTURING THE SAME

(75) Inventors: Jeong Seok Kim, Ulsan (KR); Seok Jung, Ulsan (KR); You Han Kim, Ulsan (KR); Jin Ho Pyo, Busan (KR); Yong Seog Kim, Seoul (KR); Kyung Hyun Park, Seoul (KR)

(73) Assignee: CE & Chem Inc., Ulsan (KR)

( * ) Notice: Subject to any disclaimer, the term of this patent is extended or adjusted under 35 U.S.C. 154(b) by 622 days.

(21) Appl. No.: 11/707,596

(22) Filed: Feb. 16, 2007

(65) Prior Publication Data

US 2008/0085375 A1 Apr. 10, 2008

(30) Foreign Application Priority Data

Oct. 10, 2006 (KR) ............. 10-2006-0098603

(51) Int. Cl.
*H01J 17/49* (2006.01)

(52) U.S. Cl. ................................ 313/587; 445/23

(58) Field of Classification Search .......... 313/582–587
See application file for complete search history.

(56) References Cited

U.S. PATENT DOCUMENTS

| | | | | |
|---|---|---|---|---|
| 5,454,861 A | * | 10/1995 | Hasegawa et al. | 106/2 |
| 2006/0134437 A1 | * | 6/2006 | Lee et al. | 428/432 |
| 2007/0262715 A1 | * | 11/2007 | Yan et al. | 313/582 |

FOREIGN PATENT DOCUMENTS

| | | | |
|---|---|---|---|
| JP | 2005-149743 | * | 6/2005 |
| JP | 2005-264272 | * | 9/2005 |
| KR | 1998-042303 | * | 8/1998 |

* cited by examiner

*Primary Examiner*—Joseph L Williams
(74) *Attorney, Agent, or Firm*—Ladas & Parry LLP

(57) ABSTRACT

An MgO protective layer formed on a front substrate of a plasma display panel and a method of manufacturing the protective layer are disclosed. The protective layer is manufactured by using an MgO pellet, which is simultaneously doped with a first doping material of BeO and/or CaO among alkali earth metals and a second material selected from the group consisting of $Sc_2O_3$, $Sb_2O_3$, $Er_2O_3$, $Mo_2O_3$, and $Al_2O_3$, as a deposition source through a vacuum deposition method. The protective layer remarkably improves a discharge efficiency of the PDP and shortens a discharge delay time, so that it is applied to a signal can PDP. Also, it lowers a manufacturing cost by reducing the number of electronic components.

4 Claims, 5 Drawing Sheets

US 7,868,550 B2

PROTECTIVE LAYER MATERIAL FOR PDP AND METHOD OF MANUFACTURING THE SAME

CROSS-REFERENCE TO RELATED APPLICATION

This application is based on and claims priority from Korean Patent Application No. 10-2006-0098603, filed on Oct. 10, 2006 in the Korean Intellectual Property Office, the disclosure of which is incorporated herein in its entirety by reference.

BACKGROUND OF THE INVENTION

1. Field of the Invention

The present invention relates to an MgO protective layer material for use in a front substrate of a plasma display panel and a method of fabricating the same, and more particularly, to a method forming a protective layer for a plasma display panel by using an MgO pellet simultaneously doped with a first doping material of BeO and/or CaO among alkali earth metal 2 group and a second material selected from the group consisting of $Sc_2O_3$, $Sb_2O_3$, $Er_2O_3$, $Mo_2O_3$, and $Al_2O_3$, through a thin film forming process, such as electron-beam evaporation, ion plating, or sputtering, in which the first doping material and the second doping material are respectively doped the range of 50 ppm to 8000 ppm.

2. Description of the Prior Art

A PDP is a flat display panel, and is usually employed in wide display apparatuses of more than 40 inches because of their good image quality and thin and light features. The PDP includes a plurality of barrier ribs formed on a front substrate, a plurality of address electrodes formed on the rear substrate, and a plurality of sustain electrodes formed on a front substrate, in which pixels are formed at cross areas of the address electrodes and the address electrodes to form an image.

In FIG. 1 there is schematically shown the structure of such a PDP. A front substrate 10 made of a glass or metal substrate is coated by a transparent dielectric layer 20, and an address electrode 50 is formed on the rear substrate 80 or the rear dielectric layer 90. A stripe barrier rib 60 is interposed between the address electrodes 50, and a spatial surface defined by the barrier ribs is coated by a phosphor to form a sub-pixel. A plurality of sustain electrodes and scan electrodes are formed on a front substrate 10 made of glass. An upper dielectric layer 20 is formed to cover the sustain electrode 40 and the scan electrode, and an MgO protective layer 30 covers the upper dielectric layer 20. When the front substrate 10 is coupled to the rear substrate 80, a plurality of pixel spaces isolated by the barrier ribs 60 are formed between the substrates. The isolated spaces are filled with a discharge gas, such as a rare gas of Ne and Xe or Ne, He, and Xe, and are sealed at a certain pressure.

If a driving voltage is applied to the sustain electrode 40 and the address electrode 50, plasma is produced in the spaces due to glow discharge. If a sustain voltage is applied to the sustain electrode and the scan electrode, a glow discharge is produced between the sustain electrodes in the discharge cell, in which a wall voltage is produced. In this instance, the phosphor coated on the sidewalls and bottom surface of the discharge cell is exited by vacuum ultraviolet rays produced from the plasma to generate red, green and blue visible rays.

The MgO protective layer induces secondary electron emission and exoelectron emission in the glow discharge, thereby attenuating the discharge voltage and improving a discharge delay. Therefore, the MgO protective layer is used as an electron emission layer from an early stage the PDP's development. In order to reduce the consumption power of the PDP, however, secondary electron emission coefficient should be further improved to attenuate a discharge starting voltage. In addition, in order to reduce costs of components to be required for single scan drive, it should further improve the discharge delay induced by the improved feature of the exo-electron emission.

Several methods of improving the secondary electron emission coefficient by using oxide doping have been proposed. Specifically, the method is to positively adjust an electron emission characteristic of MgO by controlling a defect energy level and concentration of MgO using a doping element. It is known that Auger neutralization leads to the secondary electron emission from an MgO surface, which is shown in FIG. 2. When ions generated through discharge of the PDP reaches the MgO surface, electrons in a 2P electron orbit of oxygen ion of MgO induces neutralization with ions due to tunneling. The energy generated at that time is transferred to the electrons existed in a valance band, thereby emitting the electrons outwardly. It is possible that metastable energy of the discharge gas, photon energy, and an electric field of wall charge supply the energy required for the secondary electron emission, as well as ionization energy of the discharge gas. Consequently, in order to emit the electrons by use of various energy sources to be generated at the PDP discharge, it is necessary to a defect level in the MgO band gap, thereby easily emitting electrons.

The method of improving the electron emission by adding a doping element is disclosed by Japanese Patent Application Nos. 2003-00331163 and 2003-00335271, Korean Patent Application Nos. 2004-0037268, 2004-0108075, and 2005-0061426, and U.S. Patent Application No. 2006-0145614.

Japanese Patent Publication No. 2005-123172 proposes MgO materials using at least one element selected from Si, Ge, C, and Sn, and at least one element selected from fourth, fifth, sixth and seventh group element of the periodic table as a doping element. Each concentration of at least one element selected from Si, Ge, C and Sn ranges from 20 ppm by weight to 8000 ppm by weight, and each concentration of at least one element selected from fourth, fifth, sixth and seventh group elements of the periodic table ranges from 10 ppm by weight to 10000 ppm by weight.

Japanese Patent Publication No. 2005-123173 proposes MgO materials comprising magnesium carbide such as $MgC_2$, $Mg_2C_3$, or $Mg_3C_4$. A concentration of the magnesium carbide ranges from 50 ppm by weight to 7000 ppm by weight.

Korean Patent Application No. 2005-0061426 provides a protective layer doped with Si. The composite has a characteristic in that a discharge delay is minimized. In this instance, contents of impurities are limited to Ca of up to 50 ppm, Al of up to 250 ppm, Ni of up to 5 ppm, Na of up to 5 ppm, and K of up to 5 ppm.

Korean Patent Application No. 2004-0037268 provides a material of an MgO protective layer using as dopants including Ca, Al, Fe, and Si. These dopants minimize a time of PDP discharge delay due to their interaction with each other. There is disclosed a composite consisting of Ca of 100 to 300 ppm, Al of 60 to 90 ppm, Fe of 60 to 90 ppm, Si of 40 to 100 ppm.

Korean Patent Application No. 2004-0108075 provides an MgO composite consisting of one or more elements selected from the group consisting of Al, Ca, and Si, in addition to at least one selected from the group consisting of rare earth elements. The composite consists of Sc of 50 to 600 ppm per 1 gram of MgO, Ca of 50 to 400 ppm per 1 gram of MgO, Al of 50 to 400 ppm per 1 gram of MgO, and Si of 50 to 400 ppm per 1 gram of MgO. In addition, the composite contains impurities consisting of Mn, Na, K, Cr, Fe, Zn, Bi, Ni, and Zr, in which Mn is up to 50 ppm per a gram of MgO, Na is up to 30 ppm per a gram of MgO, K is up to 30 ppm per a gram of MgO, Cr is up to 10 ppm per a gram of MgO, and Fe is up to 20 ppm per a gram of MgO.

U.S. Patent Application No. 2006-0145614 provides an MgO composite doped with Sc, Ca, and Si. The patent discloses that if a content of Sc ranges from 50 ppm to 2000 ppm, a content of Ca ranges from 100 ppm to 1000 ppm, and a content of Si ranges from 30 ppm to 500 ppm, the discharge delay is remarkably minimized. The use of the doped MgO or the adjustment of atmosphere conditions of MgO deposition improves the characteristic of the MgO layer, thereby improving the discharge efficiency and shortening the time of discharge delay, which remarkably contributes to a performance of the PDP.

SUMMARY OF THE INVENTION

Accordingly, the present invention has been made to solve the above-mentioned problems occurring in the prior art while advantages achieved by the prior art are maintained intact.

One object of the present invention is to provide a method of forming a deflect level in a proper position of an MgO band gap. That is, in order to effectively utilize holes and electrons, which are generated during discharge, on or in an MgO surface during the discharge, MgO is doped to form a defect level which can trap the holes and electrons. A defect is extrinsically induced in MgO by doping the same with a new element, thereby improving the problems of the prior art and the electron emission characteristic of MgO which is demanded from the past. The object will be described in detail.

First, a trap site is created by adding a first doping material, and an electron trapping site is created by adding a second doping material, thereby providing an MgO pellet material which can improve a light emitting efficiency of a PDP and shorten a discharge delay time.

Second, the solubility of a doping element is selected in view of radius and atomic value of an ion. More specifically, as a radius difference between Mg ion and doping ion is small and an atomic value difference between Mg ion and doping ion is large, the solubility of the doping element in the MgO is decreased. Therefore, in case of a material having the large ion radius difference or large atomic value difference in the dopant, the solubility is too low in a process of forming the MgO layer, so that the material is not doped and thus is extracted as a second phase. As a result, it cannot obtain the effect of improving the discharge characteristic of the doping. The present invention provides a component capable of maximizing a doping effect by selecting an element having large solubility.

Another object of the present invention provides a method of manufacturing a PDP in which the discharge efficiency is increased due to the improved electron emission characteristic thereby to reduce a consumption power. As a result, the discharge delay is minimized to implement a full HD single scan PDP.

In order to accomplish these objects, there is provided a plasma display panel, to which a protective layer and a method of manufacturing the protective layer according to the present invention are applied, in which a plurality of electrodes formed on display regions of a front substrate are driven in a single scan driving manner, and a discharge space is filled with a Xe gas, according to the present invention, which includes a protective film covering a front dielectric layer which coats a plurality of scan electrodes formed on the front substrate, a rear substrate disposed opposite to the front substrate, a plurality of address electrodes formed on the rear substrate, a rear dielectric layer covering the address electrodes, barrier ribs formed on the rear dielectric layer, and a phosphor layer formed on the rear dielectric layer and the barrier ribs.

According to another aspect of the present invention, there is provided a protective layer comprising MgO consisting of a first doping material of BeO and/or CaO among alkali earth metals and a second material selected from the group consisting of $Sc_2O_3$, $Sb_2O_3$, $Er_2O_3$, $Mo_2O_3$, and $Al_2O_3$. The first doping material and the second doping material are respectively added into MgO in the range of 50 ppm to 8000 ppm.

According to still another aspect of the present invention, there is provided a method of forming a protective layer for an AC PDP, which includes evenly mixing a deposition source of $Mg(OH)_2$, a first doping material selected from the group consisting of BeO and CaO or a precursor thereof, and a second material selected from the group consisting of $Sc_2O_3$, $Sb_2O_3$, $Er_2O_3$, $Mo_2O_3$, and $Al_2O_3$ or a precursor thereof, pressing the mixture in a mold to form a pellet-shaped material, calcining the pellet-shaped material, sintering the pellet-shaped material to form a pellet for a deposition source used to form the protective layer, and vacuum depositing the pellet to form the protective layer.

The protective layer comprises impurities of Fe of up to 30 ppm, Al of up to 50 ppm, Si of up to 50 ppm, Ni of up to 5 ppm, Na of up to 50 ppm, and K of up to 5 ppm.

The protective layer of the present invention is formed by using an MgO deposition source consisting of a first doping material of BeO and/or CaO among alkali earth metals and a second material selected from the group consisting of $Sc_2O_3$, $Sb_2O_3$, $Er_2O_3$, $Mo_2O_3$, and $Al_2O_3$. The deposition source material is manufactured by using single crystal or polycrystal MgO containing the first doping material and the second doping material together. The single crystal MgO containing the first doping material and the second doping material together may be manufactured by arc fusion using high-purity MgO as a material, and may contain inevitable impurities. The polycrystal MgO containing the first doping material and the second doping material together may be manufactured by a pellet-shaped material formed through calcing and sintering process.

The protective layer of the present invention is formed on the dielectric layer of the front substrate, in which a plurality of sustain electrodes are covered with the dielectric layer, through the vacuum deposition such as electron-beam evaporation, ion plating, sputtering, or chemical vapor deposition.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. The matters defined in the description, such as the detailed construction and elements, are nothing but specific details provided to assist those of ordinary skill in the art in a comprehensive understanding of the invention, and thus the present invention is not limited thereto.

Figure 1:
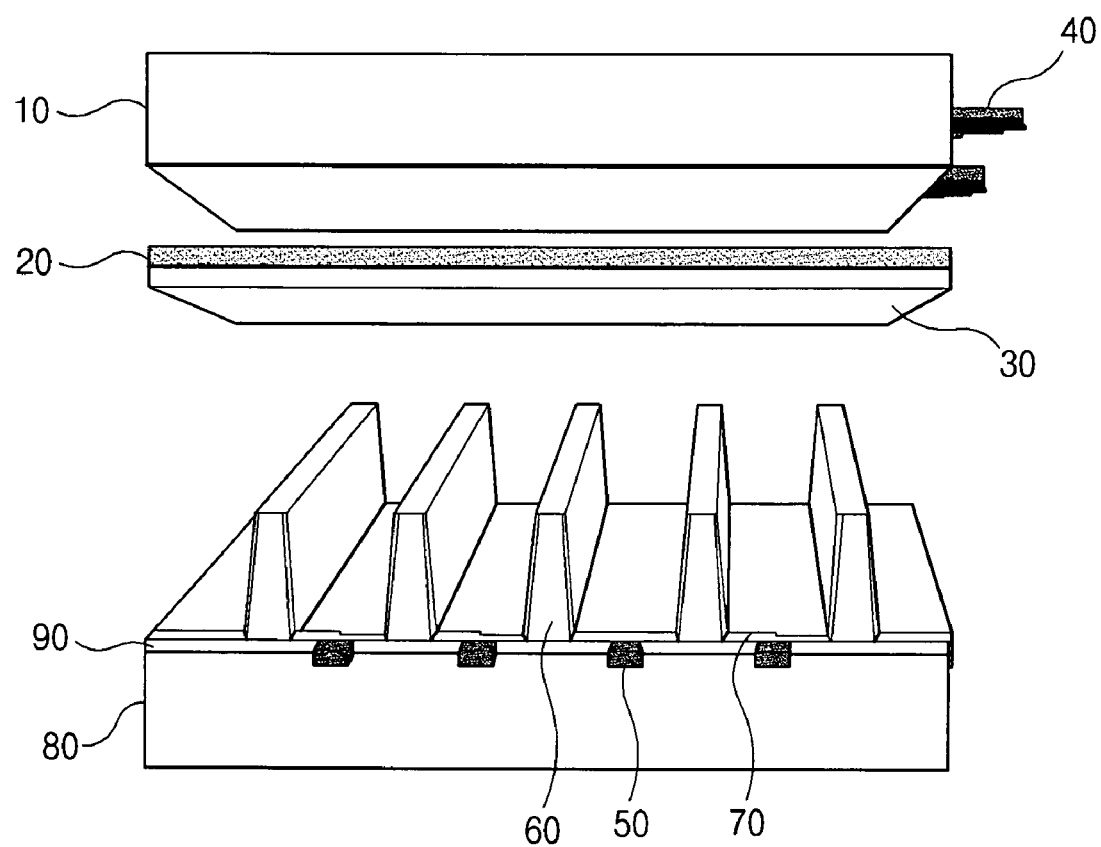
FIG. 1 is a perspective view schematically illustrating the structure of a plasma display panel.
Figure 2:
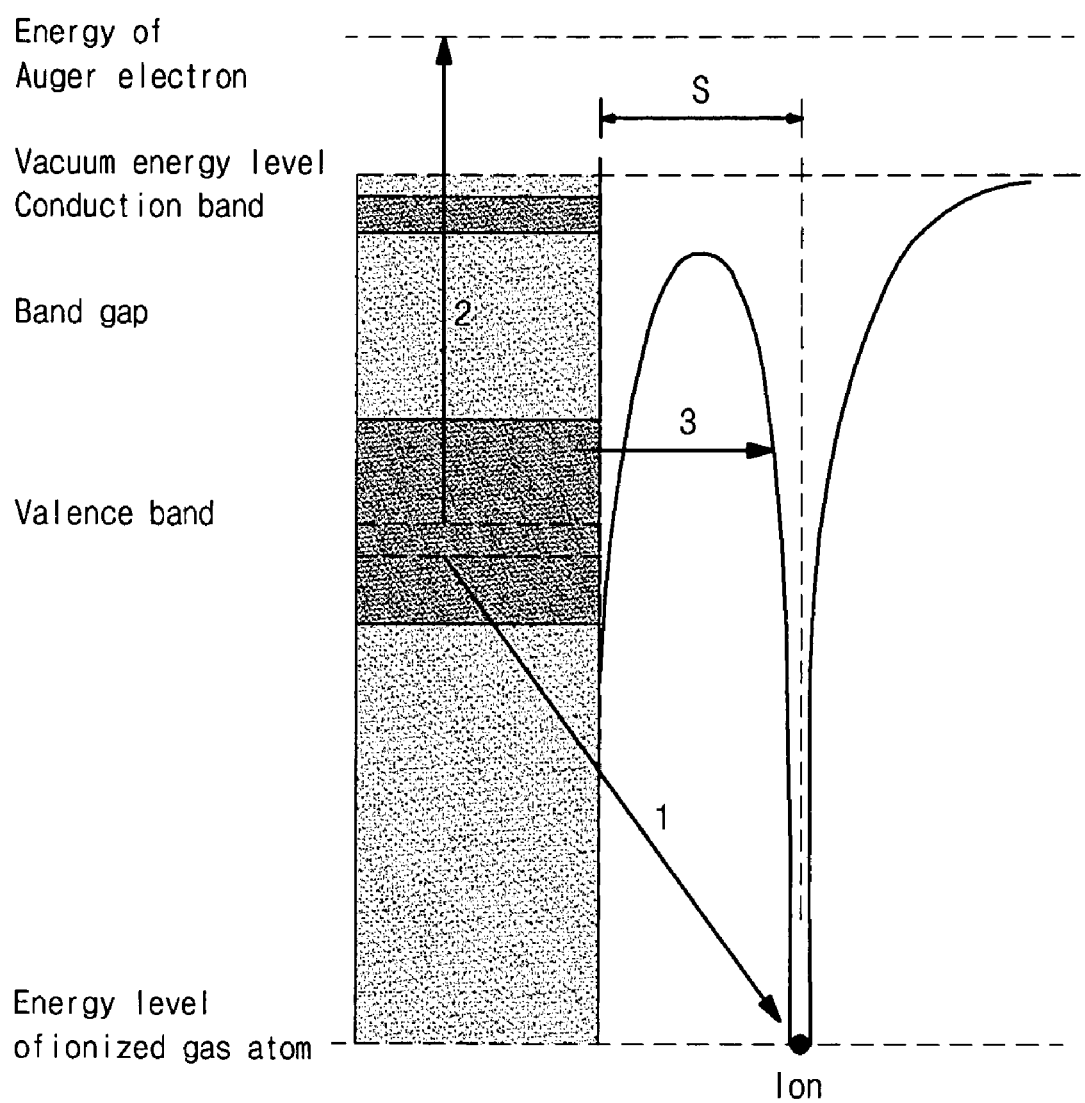
FIG. 2 is a view depicting the process of emitting electrons based on Auger neutralization.
Figure 3:
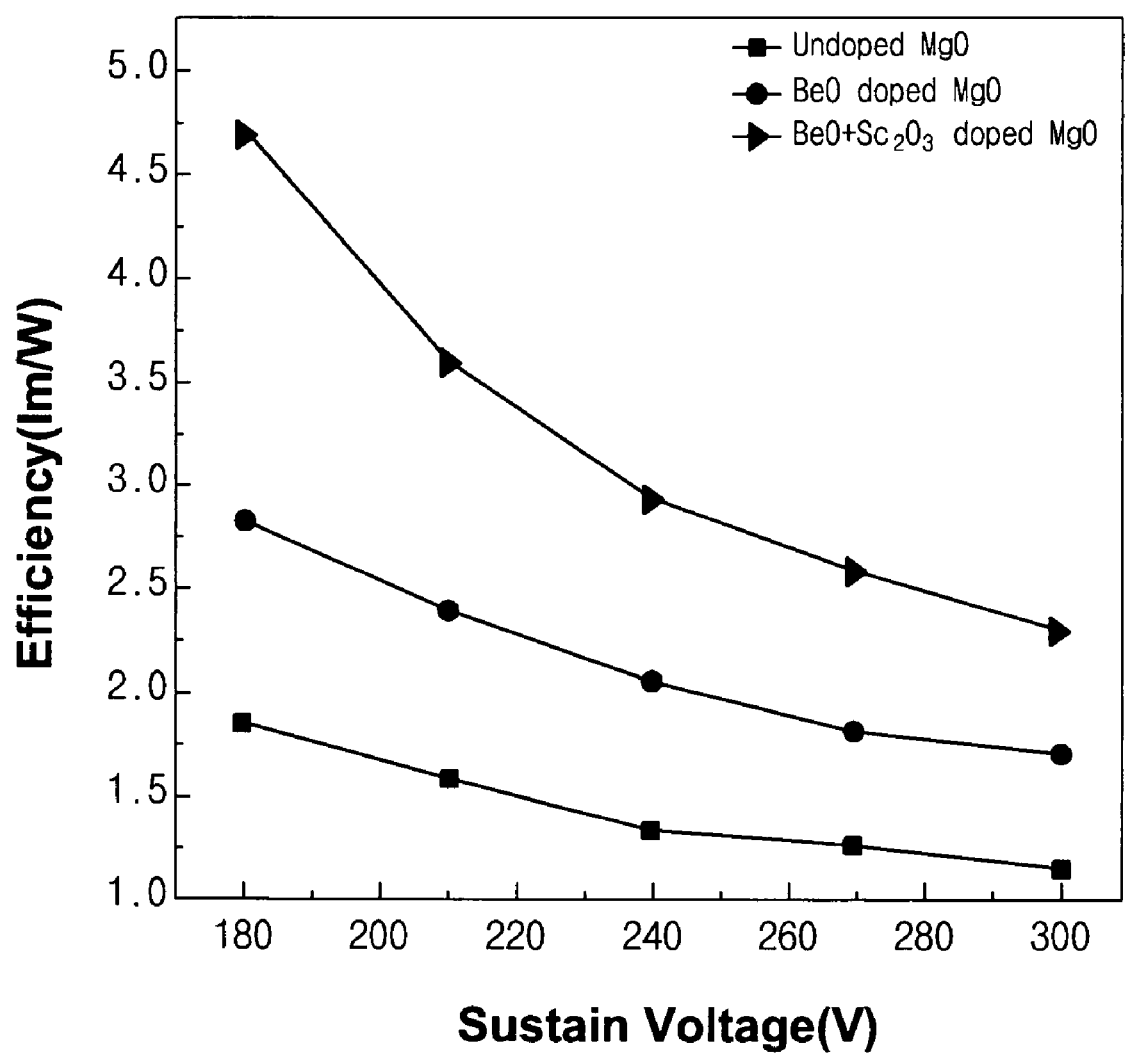
FIG. 3 is a graph depicting the experiment results obtained by comparing discharge efficiencies in case in which a discharge gas consisting of Ne and 4% Xe is used in panels each manufactured by using an MgO deposition source simultaneously doped with BeO and $Sc_2O_3$, an MgO deposition source doped with BeO, and an undoped MgO deposition source.

FIG. 3 shows an embodiment of the present invention, which shows the experiment results obtained by comparing discharge efficiencies of a panel manufactured by using MgO, which contains BeO as a first doping material and $Sc_2O_3$ as a second doping material, as a deposition source through an electron beam deposition method; a panel manufactured by using MgO, which contains only BeO as a first doping material, as a deposition source through an electron beam deposition method; and a panel manufactured by a protective layer formed by using MgO as a deposition source.

It will be known from FIG. 3 that the light emitting efficiency of the panel manufactured by using the MgO deposition source doped with BeO of the first doping material is higher than that of the panel manufactured by using the undoped MgO deposition, but the light emitting efficiency of the panel manufactured by using the MgO deposition source simultaneously doped with BeO of the first doping material and $Sc_2O_3$ of the second doping material is further increased. The first doping material and the second doping material extrinsically form a defect level of holes and electrons in an MgO base, respectively, which contributes the improved characteristic. This experiment was measured under conditions of a discharge gas of Ne and 4% Xe and an AC discharge frequency of 30 kH.

Figure 4:
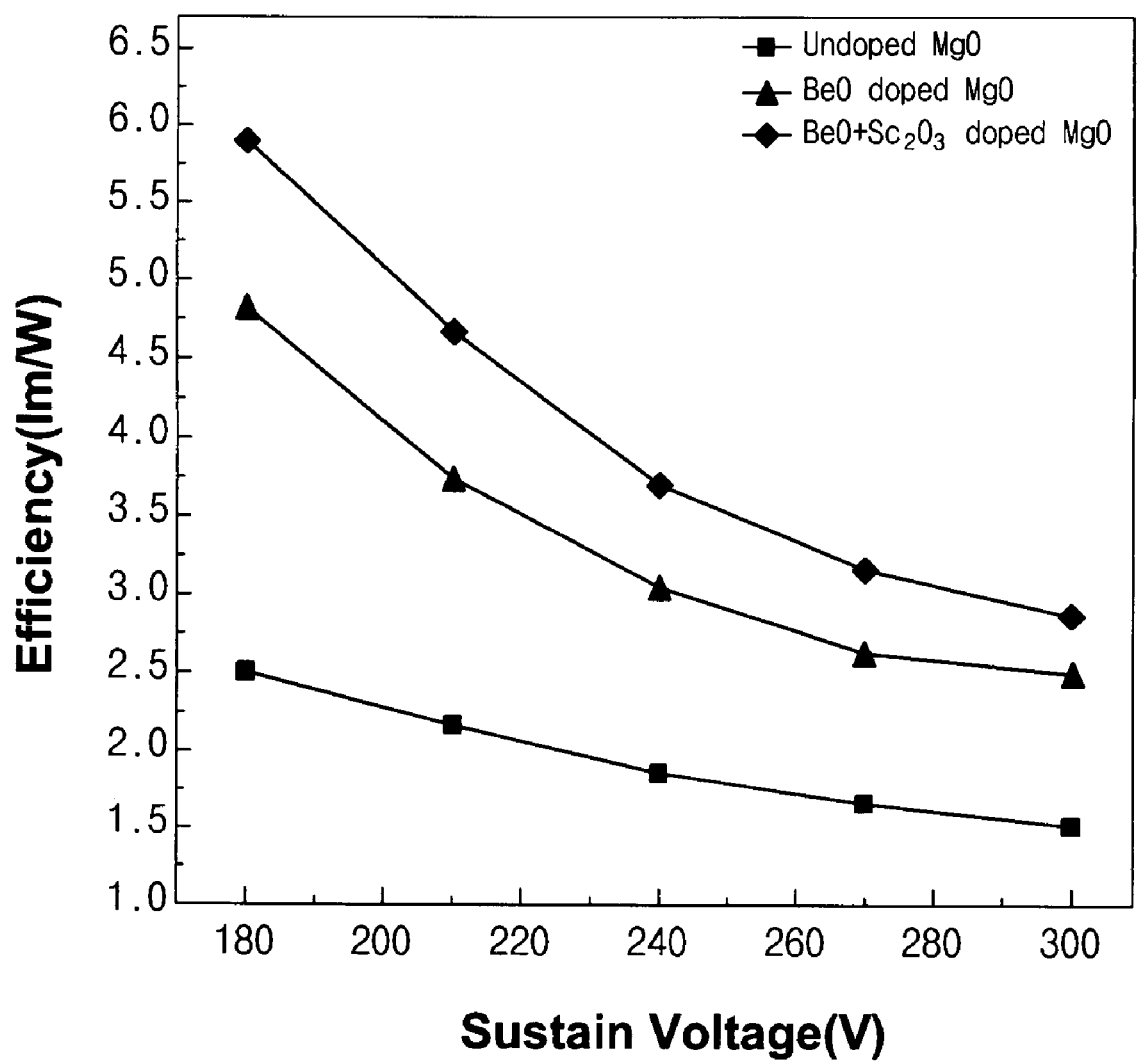
FIG. 4 is a graph depicting the experiment results obtained by comparing discharge efficiencies in case in which a discharge gas consisting of Ne and 10% Xe is used in panels each manufactured by using an MgO deposition source simultaneously doped with BeO and $Sc_2O_3$, an MgO deposition source doped with BeO, and an undoped MgO deposition source.

FIG. 4 shows the influence of a doping element on the discharge efficiency, when the discharge gas is replaced by a discharge gas of Ne and 10% Xe under the same conditions as those of FIG. 3. It will be known from FIG. 4 that the light emitting efficiency of the panel manufactured by doping with BeO of the first doping material is higher than that of the panel manufactured by using the discharge gas of Ne and 4% Xe. In this instance, however, the light emitting efficiency of the panel manufactured by simultaneously doping with BeO of the first doping material and $Sc_2O_3$ of the second doping material is further increased.

Figure 5:
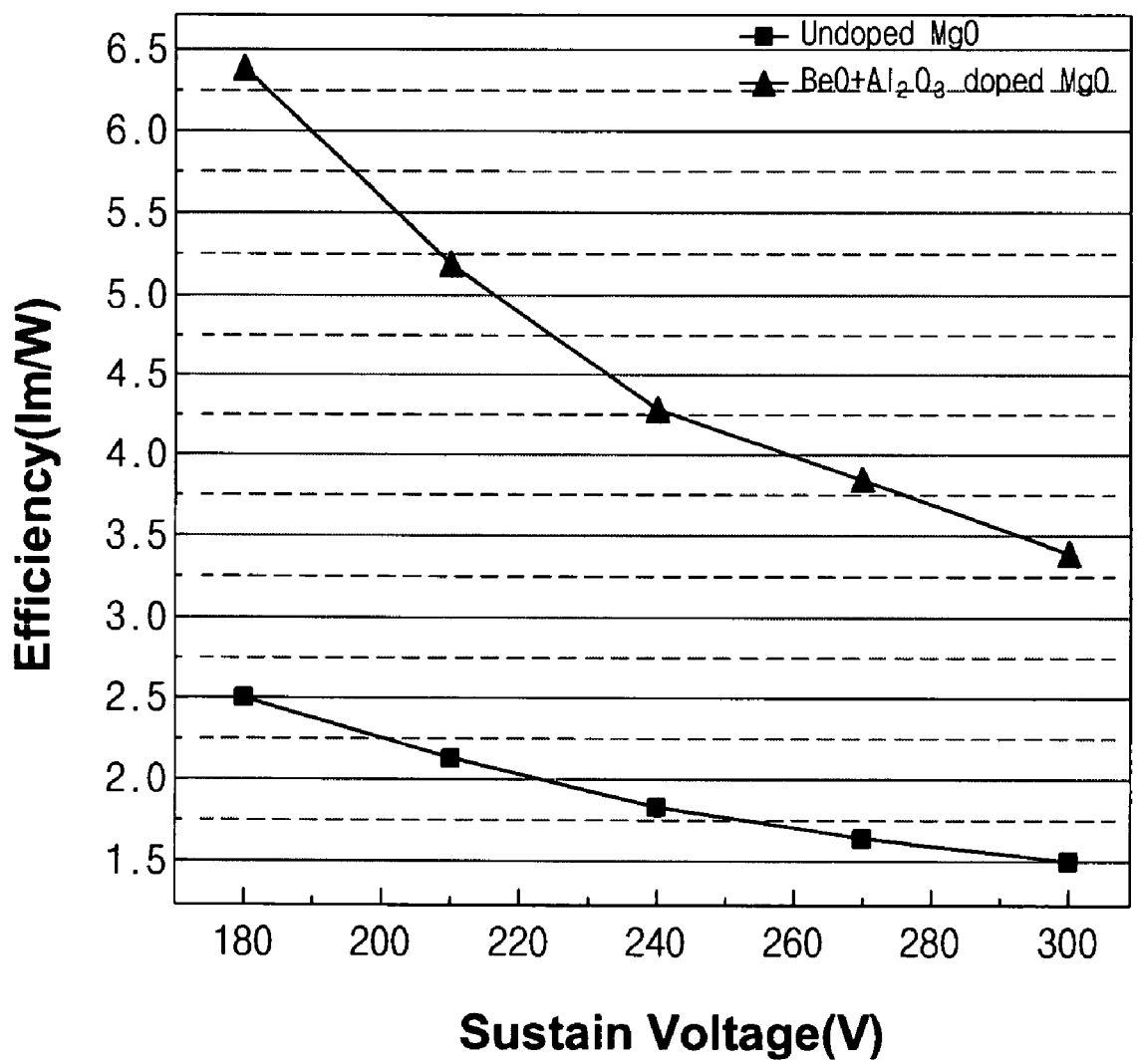
FIG. 5 is a graph depicting the experiment results obtained by comparing discharge efficiencies in case in which a discharge gas consisting of Ne and 10% Xe is used in panels each manufactured by using an MgO deposition source simultaneously doped with BeO and $Al_2O_3$ and an undoped MgO deposition source.

FIG. 5 shows the discharge efficiency of the panel manufactured by simultaneously doping with BeO of the first doping material and $Al_2O_3$ of the second doping material. The result is obtained by using a discharge gas of Ne and 10% Xe. It will be known from FIG. 5 that the discharge efficiency is remarkably increased in case of simultaneously doping with BeO doping element to form holes and $Al_2O_3$ doping element to form trapped electron levels. The discharge efficiency is remarkably increased by applying the protective layer of the present invention to the PDP panel, thereby reducing the consumption power of the PDP and lowering a manufacturing cost.

Also, the present invention relates to a plasma display panel manufactured by using a front substrate with the protective layer formed thereon. The method of manufacturing the PDP using the front substrate with the protective layer is well known in the art, and thus will be not described in detail.

With the above description, the protective layer of the present invention consists of MgO containing BeO or CaO as a first doping material, and $Sc_2O_3$, $Sb_2O_3$, $Er_2O_3$, $Mo_2O_3$, or $Al_2O_3$ as a second doping material. The panel including the protective layer has good discharge characteristics of the increased discharge efficiency and the shortened discharge time. Consequently, the protective layer of the present invention can be applied to a high-resolution HD or full HD PDP.

Although preferred embodiments of the present invention have been described for illustrative purposes, those skilled in the art will appreciate that various modifications, additions and substitutions are possible, without departing from the scope and spirit of the invention as disclosed in the accompanying claims.

Features shown in broken lines show environmental structure and form no part of the claimed design.

What is claimed is:

1. A protective layer for an AC PDP, formed by using a deposition source comprising first doping material of BeO and second material of $Sc_2O_3$, through a vacuum deposition process.

2. The protective layer as claimed in claim 1, wherein the first doping material and the second doping material are respectively added into MgO in the range of 50 ppm to 8000 ppm.

3. The protective layer as claimed in claim 2, wherein the first doping material and the second doping material range from 500 ppm to 2000 ppm, respectively.

4. The protective layer as claimed in claim 1, wherein the protective layer comprises impurities of Fe of up to 30 ppm, Al of up to 50 ppm, Si of up to 50 ppm, Ni of up to 5 ppm, Na of up to 50 ppm, and K of up to 5 ppm.

* * * * *